United States Patent
Schindler et al.

(10) Patent No.: US 6,168,988 B1
(45) Date of Patent: Jan. 2, 2001

(54) METHOD FOR PRODUCING BARRIER-FREE SEMICONDUCTOR MEMORY CONFIGURATIONS

(75) Inventors: Günther Schindler; Walter Hartner; Frank Hintermaier, all of München; Carlos Mazure-Espejo, Zorneding, all of (DE)

(73) Assignee: Infineon Technologies, AG, Munich (DE)

(*) Notice: Under 35 U.S.C. 154(b), the term of this patent shall be extended for 0 days.

(21) Appl. No.: 09/281,691

(22) Filed: Mar. 30, 1999

Related U.S. Application Data

(63) Continuation of application No. PCT/DE97/02032, filed on Sep. 11, 1997.

(30) Foreign Application Priority Data

Sep. 30, 1996 (DE) .............................................. 196 40 273

(51) Int. Cl.[7] ...................... H01L 21/8242; H01L 21/00; H01L 21/76
(52) U.S. Cl. .............................. 438/253; 438/3; 438/239; 438/240; 438/396
(58) Field of Search .............................. 438/3, 239, 240, 438/253, 396

(56) References Cited

U.S. PATENT DOCUMENTS

| 5,313,089 |   | 5/1994  | Jones, Jr. . |         |
|-----------|---|---------|--------------|---------|
| 5,346,844 | * | 9/1994  | Cho et al.   | 438/396 |
| 5,751,540 | * | 5/1998  | Lee et al.   | 361/321.4 |
| 5,798,289 | * | 8/1998  | Ajika et al. | 438/239 |
| 5,801,079 | * | 9/1998  | Takaishi     | 438/396 |
| 5,843,818 | * | 12/1998 | Joo et al.   | 438/240 |
| 5,863,821 | * | 1/1999  | Chao         | 438/253 |
| 5,946,569 | * | 8/1999  | Huang        | 438/253 |
| 5,972,769 | * | 10/1999 | Tsu et al.   | 438/396 |

FOREIGN PATENT DOCUMENTS

| 4222467C1 | 6/1993  | (DE) . |
| 5-343615  | 12/1993 | (JP) . |

* cited by examiner

Primary Examiner—John F. Niebling
Assistant Examiner—Jennifer M. Kennedy
(74) Attorney, Agent, or Firm—Herbert L. Lerner; Laurence A. Greenberg; Werner H. Stemer

(57) ABSTRACT

A method for producing an integrated semiconductor memory configuration, in particular uses ferroelectric materials as storage dielectrics. A conductive connection between a first electrode of a storage capacitor and a selection transistor is produced only after deposition of the storage dielectric.

11 Claims, 4 Drawing Sheets

METHOD FOR PRODUCING BARRIER-FREE SEMICONDUCTOR MEMORY CONFIGURATIONS

CROSS-REFERENCE TO RELATED APPLICATION

This application is a continuation of copending International Application No. PCT/DE97/02032, filed Sep. 11, 1997, which designated the United States.

BACKGROUND OF THE INVENTION

FIELD OF THE INVENTION

The invention relates to a method for producing an integrated semiconductor memory configuration.

Semiconductor-based memory configurations usually include a number of memory cells each having a selection transistor and a storage capacitor connected to the selection transistor. A method for producing such memory configurations usually includes applying first electrodes over conductive connections. In each case, one of the conductive connections connects one of the first electrodes to one of the selection transistors. A storage dielectric is applied over the first electrode and, in turn, a second electrode is applied on the storage dielectric. As a result, the first and second electrodes as well as the intermediate storage dielectric form a storage capacitor which is connected to one of the selection transistors.

A memory configuration of that type is disclosed, for example, in Japanese Patent Publication No. 5-343615(A). The known semiconductor memory configuration has a first and a second electrode which are disposed on the surface of an insulation layer above the semiconductor body and are perpendicular to the surface of the insulation layer.

One use of novel ferroelectric materials as a storage dielectric of storage capacitors enables semiconductor memories to be produced which do not lose their information that is stored in the form of an electric charge after a failure of a supply voltage and/or which have memory contents that do not have to be refreshed at regular intervals due to leakage currents that occur.

What is critical in the course of using most of the previously known ferroelectric materials of that type is their processing within a semiconductor process. Most of the ferroelectric materials of that type are deposited at high temperatures in an oxygen-containing atmosphere. The use of ferroelectric materials of that type in the method described above, in which the storage dielectric is applied over the first electrode that, in turn, is situated over a conductive connection to one of the selection transistors, results in oxidation of the conductive connection. That is because during the deposition of the ferroelectric materials, oxygen diffuses through the first electrode in the direction of the conductive connection and oxidizes the latter. Oxidation of the conductive connection means an interruption of the electrical connection between the storage capacitor and the selection transistor of a memory cell, with the result that the latter is no longer functional.

Solution approaches for the purpose of avoiding oxidation of the conductive connection during the deposition of a ferroelectric storage dielectric provide for the application of barrier layers between the conductive connection and the first electrode. In that case the barrier layers must be electrically conductive but resistant to oxidation and the diffusion through of oxygen. What is disadvantageous about using barrier layers is the difficult search for suitable materials which are both electrically conductive and oxygen-impermeable, resistant to oxidation and can be applied in a suitable manner to the conductive connections.

SUMMARY OF THE INVENTION

It is accordingly an object of the invention to provide a method for producing integrated barrier-free semiconductor memory configurations, which overcomes the hereinafore-mentioned disadvantages of the heretofore-known methods of this general type, in which ferroelectric materials can be used to produce storage dielectrics of storage capacitors to be produced and in which the use of barrier layers between a conductive connection and a first electrode can be dispensed with, with the result that, in particular, the disadvantages mentioned above do not arise.

With the foregoing and other objects in view there is provided, in accordance with the invention, a method for producing an integrated semiconductor memory configuration, which comprises providing a configuration of selection transistors in a semiconductor body and an insulation layer disposed above the semiconductor body, the selection transistors having source regions; producing contact holes in the insulation layer above the source regions within the semiconductor body; applying an auxiliary layer on a surface (first main area) of the insulation layer and subsequently forming cutouts in the auxiliary layer defining side areas of the cutouts; producing first electrodes on the side areas of the cutouts; applying a storage dielectric to the first electrodes defining free areas of the storage dielectric; applying a second electrode to the free areas of the storage dielectric; removing the auxiliary layer; and producing conductive connections each connecting a respective one of the first electrodes and the source region of a respective one of the selection transistors.

In the inventive method for producing a memory configuration, the production of a conductive connection between one of the two electrodes, in this case the first electrode, and the selection transistor, is effected only after the storage dielectric has been deposited.

The method is suitable for the use of any desired dielectrics as storage dielectrics of storage capacitors in integrated semiconductor memory configurations. It is particularly suitable for the use of ferroelectric materials as storage dielectrics, since in this method the above-mentioned problems such as the oxidation of the conductive connection to the selection transistors during the deposition of the storage dielectric cannot occur. Furthermore, the method can easily be implemented with previously known methods for producing memory configurations.

In accordance with another mode of the invention, various methods are conceivable for the production of the first electrodes on the side areas of the cutouts. One embodiment of the invention provides for the first electrodes to be produced by the deposition of a first layer made of electrode material in the direction of the first main area. The first layer is subsequently subdivided into portions of the area of the later first electrode. The subdivision is preferably effected by removal of the first layer from areas of the auxiliary layer which run parallel to the first main area and/or from uncovered regions of the first main area. Uncovered regions of the first main area may arise, for example, as a result of the production of cutouts in the auxiliary layer. The auxiliary layer is completely removed in the region of the cutouts. The cutouts preferably have a rectangular cross section, with the result that the first electrodes which are produced are disposed approximately perpendicularly on the first main area.

In accordance with a further mode of the invention, the application of the storage dielectric to the first electrodes and the subsequent application of the second electrodes are preferably effected by successive deposition of a dielectric layer and of a second layer made of electrode material in the direction of the first main area. The two layers are subsequently removed preferably from the areas of the auxiliary layer which run parallel to the first main area and are situated outside the cutouts. It is necessary to remove the two layers from the areas of the auxiliary layer which run parallel to the first main area in order to be able to remove the auxiliary layer in the next method step.

In accordance with an added mode of the invention, in order to stabilize the storage capacitors, which include the first electrode, the storage dielectric and the second electrode and stand approximately perpendicularly on the first main area in the event of the use of cutouts having a rectangular cross section, after the removal of the auxiliary layer, a stabilization layer is deposited in the direction of the first main area, and the stabilization layer is subsequently partially removed, together with the dielectric layer and the second layer, from areas of the auxiliary layer which run parallel to the first main area. Residues of the stabilization layer remain behind in the cutouts after the removal of parts of the dielectric layer and of the second layer.

It is necessary to remove the dielectric layer, the second layer made of electrode material and also, if appropriate, the stabilization layer from areas of the auxiliary layer which run parallel to the first main area, in order to be able to remove the auxiliary layer completely from the first main area and from the contact holes in the next method step.

After the removal of the auxiliary layer, the source regions of the selection transistors are uncovered and can be connected to the respective first electrodes.

In accordance with an additional mode of the invention, the conductive connection is produced by filling a region situated within the first electrodes with a conductive material.

In accordance with yet another mode of the invention, the ferroelectric properties of most of the previously known ferroelectric materials which are suitable as a storage dielectrics according to one embodiment of the invention are temperature-dependent. These ferroelectric materials have a ferroelectric behavior below a temperature which is characteristic for them, while they have a paraelectric behavior above that characteristic temperature. The dielectric constant in the paraelectric state is significantly higher than the dielectric constants of storage dielectrics used to date. The temperature below which ferroelectric properties are established is very low in the case of some ferroelectric materials, so that use of those ferroelectric materials only in the paraelectric state is appropriate from a technical standpoint. Their dielectric constant in the paraelectric state in each case is above 10, preferably above 100.

In accordance with yet a further mode of the invention, materials having a dielectric constant which is in each case greater than 10 are used as storage dielectrics, in which case such materials may, for example, be the above-mentioned ferroelectric materials that are used above the temperature which is characteristic for them.

In accordance with a concomitant mode of the invention, oxidic dielectrics are used as storage dielectrics. The class of these substances includes, for example, SBTN $SrBi_2(Ta_{1-x}Nb_x)_2O_9$, SBT $SrBi_2Ta_2O_9$, PZT $(Pb, Zr)TiO_3$, BST $(Ba, Sr)TiO_3$ or ST $SrTiO_3$. The formula $(Pb, Zr)TiO_3$ stands for $Pb_xZr_{1-x}TiO_3$. The proportion of Pb and Zr in this substrate may vary, with the ratio of Pb and Zr critically determining the temperature behavior of this dielectric, that is to say determining the temperature below which the substrate has ferroelectric properties or above which the substrate has paraelectric properties. The formula $(Ba, Sr)TiO_3$ stands for $Ba_xSr_{1-x}TiO_3$, where the temperature behavior in the case of this substrate can be critically determined by way of the ratio of Ba to Sr. The list of substances mentioned is in no way complete. The selection of one of the substances as a storage dielectric critically depends on processing factors during the production method but also on factors during the use of the semiconductor memory configuration, for example the ambient temperature.

Other features which are considered as characteristic for the invention are set forth in the appended claims.

Although the invention is illustrated and described herein as embodied in a method for producing barrier-free semiconductor memory configurations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a–1k are diagrammatic, sectional views illustrating a method according to the invention for producing a memory configuration.

DESCRIPTION OF THE PREFERRED EMBODIMENTS

Referring now in detail to the figures of the drawings, in which unless specified otherwise, identical reference symbols designate identical parts with the same meaning, and first, particularly, to FIGS. 1a to 1k thereof, there is seen an illustration of a method according to the invention for producing a memory configuration by using a number of method steps.

Figure 1A:
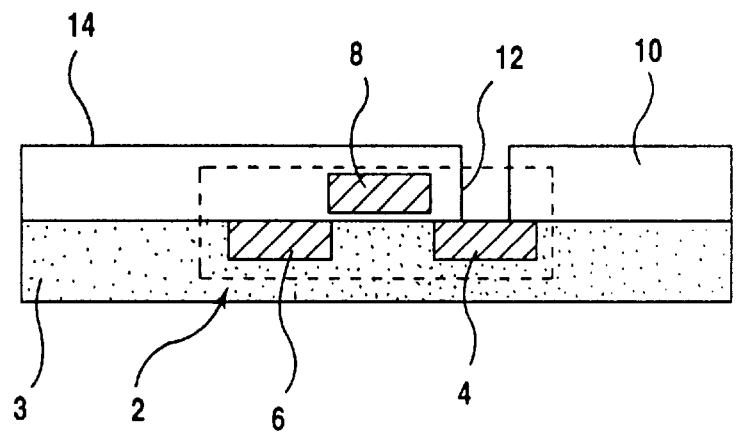

FIG. 1a shows a cross section through a portion of a configuration of selection transistors 2, that has a semiconductor body 3, above which an insulation layer 10 is disposed. A drain region 6 and a source region 4 of the illustrated selection transistor 2 are disposed in the semiconductor body 3. A gate 8 of the selection transistor is disposed in the insulation layer 10 that is located above. The source and drain regions 4, 6 may be formed, for example, of regions of the semiconductor body 3 which are doped in a complementary manner with respect to the conduction type of the semiconductor body 3. A contact hole 12 which is disposed above the source region 4 and is introduced into the insulation layer 10, enables a subsequent production of a conductive connection between the source region 4 of the selection transistor 2 and electrodes disposed on a first main area 14 of the insulation layer 10. In the following figures, the explicit illustration of the semiconductor body 3 and the reference symbols for the drain region 6 and the gate 8 have been dispensed with for reasons of clarity. Furthermore, an illustration of additional wiring, such as word lines and bit lines which usually connect a number of selection transistors 2 to one another in the case of such semiconductor memory configurations, has been dispensed with in the figures. Such configurations of selection transistors 2 can be completely preproduced and used for different methods of producing memory configurations with a very wide variety of storage capacitor geometries.

Figure 1B:
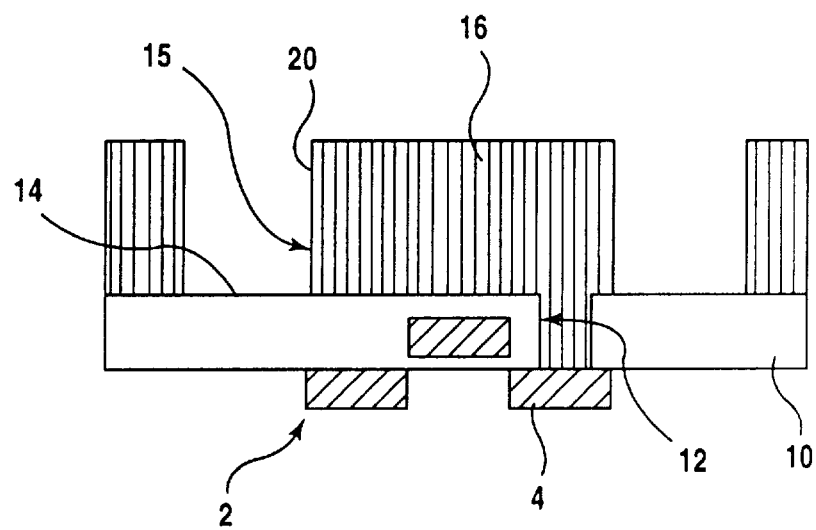

FIG. 1b shows the configuration of selection transistors 2 which is illustrated in FIG. 1a after a further method step, in which an auxiliary layer 16 having cutouts 15 has been applied over the first main area 14 of the insulation layer 10. The cutouts illustrated in the example have a rectangular cross section and can be produced, for example, by anisotropic etching of the auxiliary layer 16. Silicon nitride $Si_3N_4$, for example, can be used as a material for the auxiliary layer. As illustrated, the auxiliary layer also fills the contact holes 12 above the source regions 4 of the selection transistors 2. In the example illustrated, regions of the first main area 14 of the insulation layer 10 are uncovered in the region of the cutouts 15. However, it is also conceivable to provide cutouts 15 having a depth which is less than the thickness of the auxiliary layer 16, with the result that the first main area 14 is completely covered.

Figure 1C:
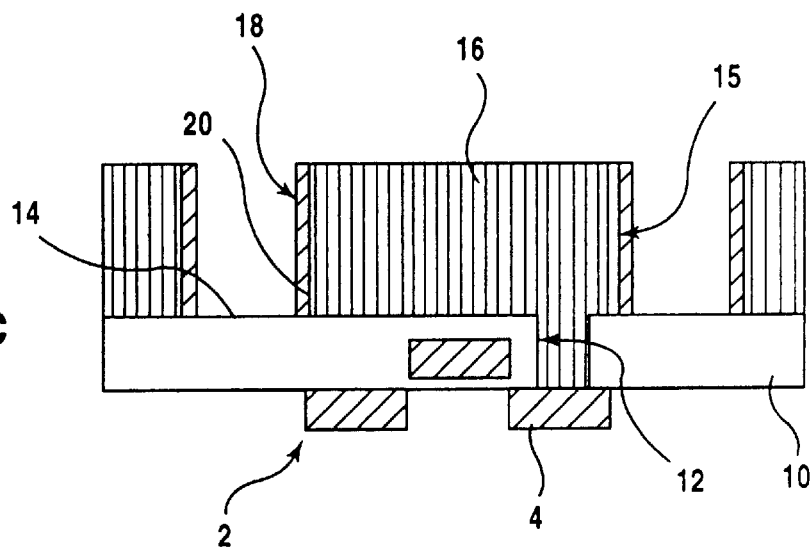
Figure 1D:
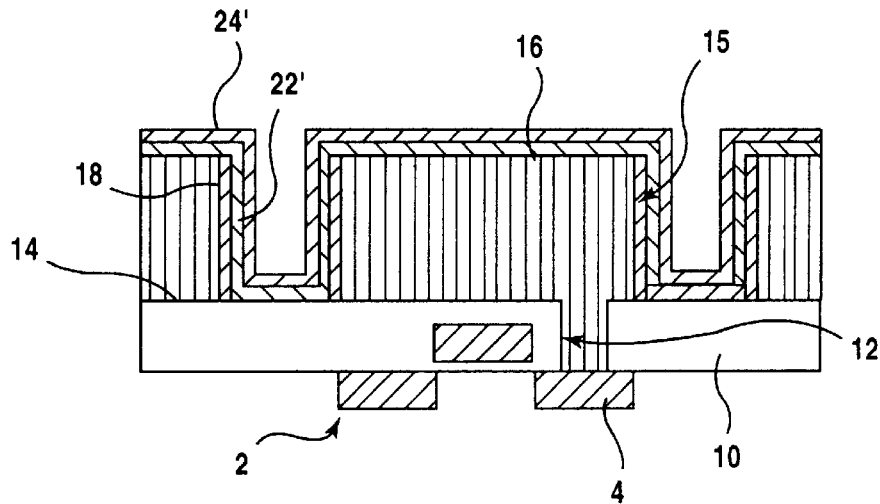

FIG. 1c shows the configuration illustrated in FIG. 1b after further method steps, in which first electrodes 18 have been applied to side areas 20 of the auxiliary layer 16. The first electrodes can be produced, for example, by the deposition of a first layer made of electrode material in the direction of the first main area 14. In that case, the production of the first electrodes 18 can be effected by removing the first layer from areas of the auxiliary layer 16 which run parallel to the first main area 14 and from uncovered regions of the first main area. The removal of the first layer from the regions discussed can be carried out, for example, by anisotropic etching of the first layer made of electrode material. As a result, the first layer is preserved only on the side areas 20 of the auxiliary layer, which run approximately perpendicularly to the first main area 14, in order to form the first electrodes 18. Platinum, for example, can be used as a material for the first layer made of electrode material. FIG. 1d shows the configuration illustrated in FIG. 1c after a further method step, in which a dielectric layer 22' and then a second layer 24' made of electrode material have been deposited over the configuration. In the next method step, a stabilization layer 26' has been deposited over the resultant configuration, thereby producing the configuration illustrated in cross section in FIG. 1e. For example, polysilicon or else an insulating material can be used as a material for the stabilization layer 26'.

Figure 1E:
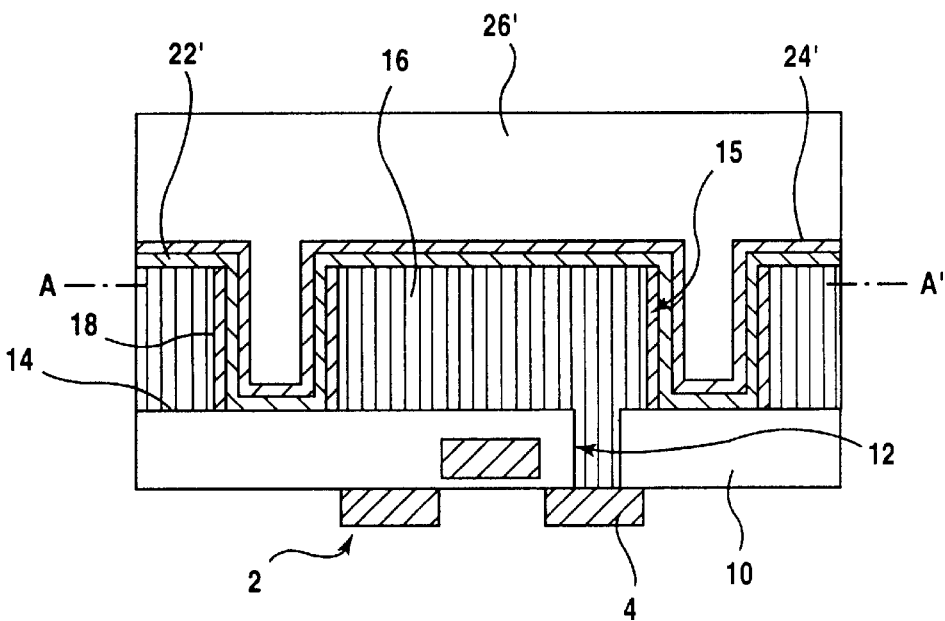
Figure 1F:
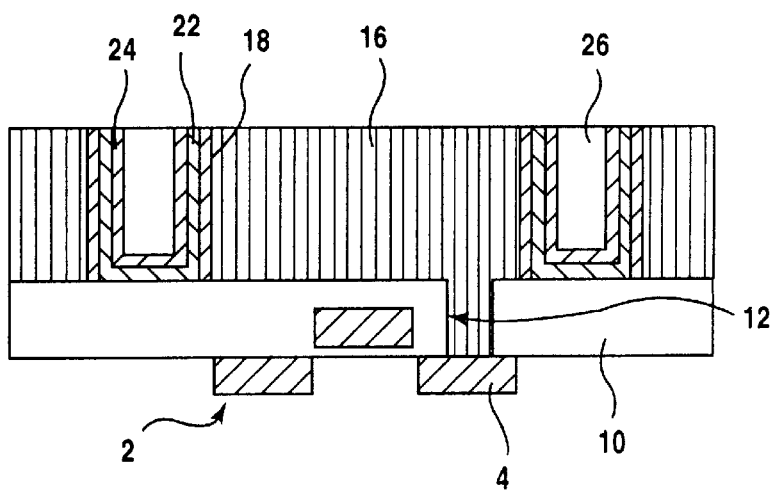

FIG. 1f shows the configuration illustrated in FIG. 1e after removal of the layers of the configuration which are situated above a line A-A' shown in FIG. 1e. As is illustrated in FIG. 1f, after this removal the auxiliary layer 16 is uncovered toward the top and the dielectric layer 22', the second layer 24' made of electrode material and the stabilization layer 26' have been removed, outside the cutouts 15, from areas of the auxiliary layer 16 which run parallel to the first main area. These layers can be removed, for example, by a CMP (Chemical Mechanical Polishing) process. As is illustrated in FIG. 1e, the line A-A' is chosen in such a way that when the layers described are removed, a small part of the auxiliary layer 16 is also removed. It is consequently intended to be ensured that, despite unevennesses, the layers described are completely removed from the desired regions. Those parts of the dielectric layer 22', of the second layer 24' made of electrode material and of the stabilization layer 26' which remain in the cutouts 15 are designated below, in accordance with the aforementioned order, as a storage dielectric 22, as a second electrode 24 and as a stabilization 26.

Figure 1G:
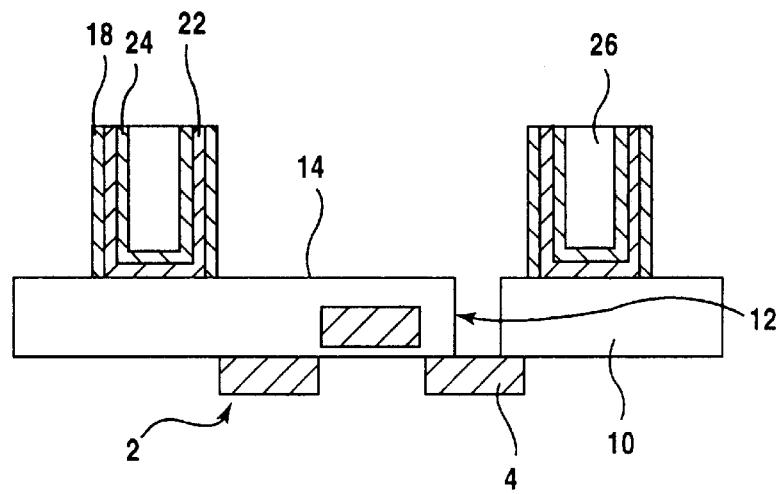

FIG. 1g shows the configuration illustrated in FIG. 1f after a further method step, in which the auxiliary layer 16 has been completely removed from the first main area 14 and from the contact holes 12. This figure clarifies the function of the stabilizations 26 which mechanically stabilize the storage capacitors that remain on the first main area 14 and include the first electrode 18, the storage dielectric 22 and the second electrode 24.

Figure 1H:
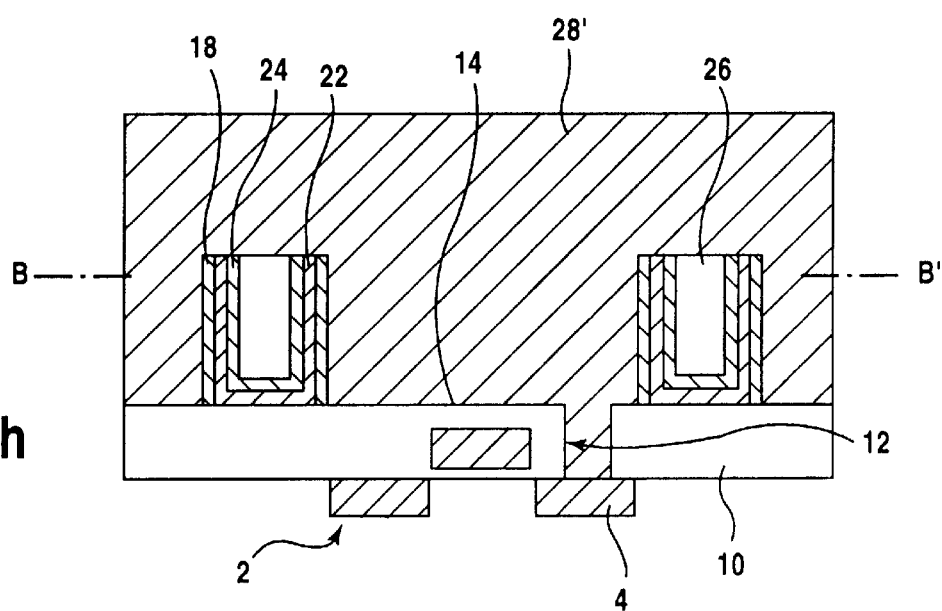

FIG. 1h shows the configuration described after a further method step, in which a third layer 28' made of conductive material, for example polysilicon, has been deposited. The function of the conductive material is to produce a conductive connection between the source region 4 of the selection transistor and the first electrode 18 of the storage capacitor. In the next method step, the third layer 28' made of conductive material must be removed to such an extent that in each case only one of the selection transistors 2 is connected to one of the first electrodes 18 in each case. This can be done, for example, by using a CMP process, wherein the third layer 28' is etched back until its height no longer exceeds the height of the first electrodes 18.

Figure 1I:
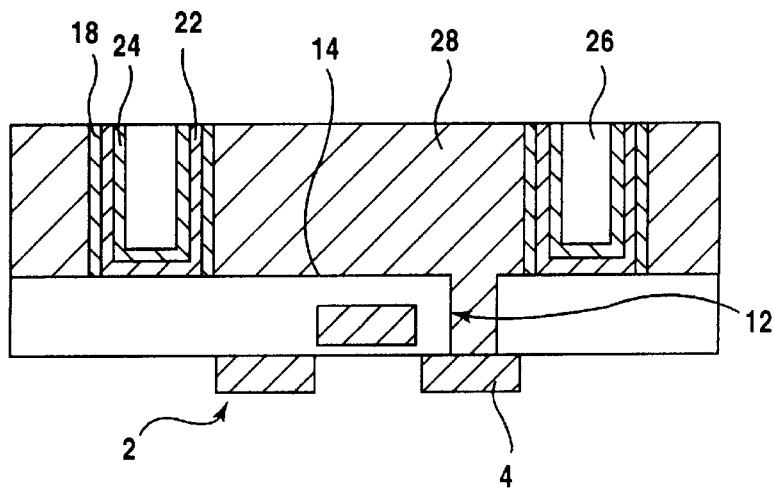

In the example illustrated, the etching back is effected as far as a line B-B', which is shown in FIG. 1h and, as evident, ends below the level of the first electrodes 18. Therefore, small parts of the storage capacitors can also be removed during the etching process. It is consequently ensured that a conductive connection 28 is produced which connects only one of the first electrodes 18 to the source region 4 of one of the selection transistors 2 in each case, as is illustrated in FIG. 1i.

Figure 1K:
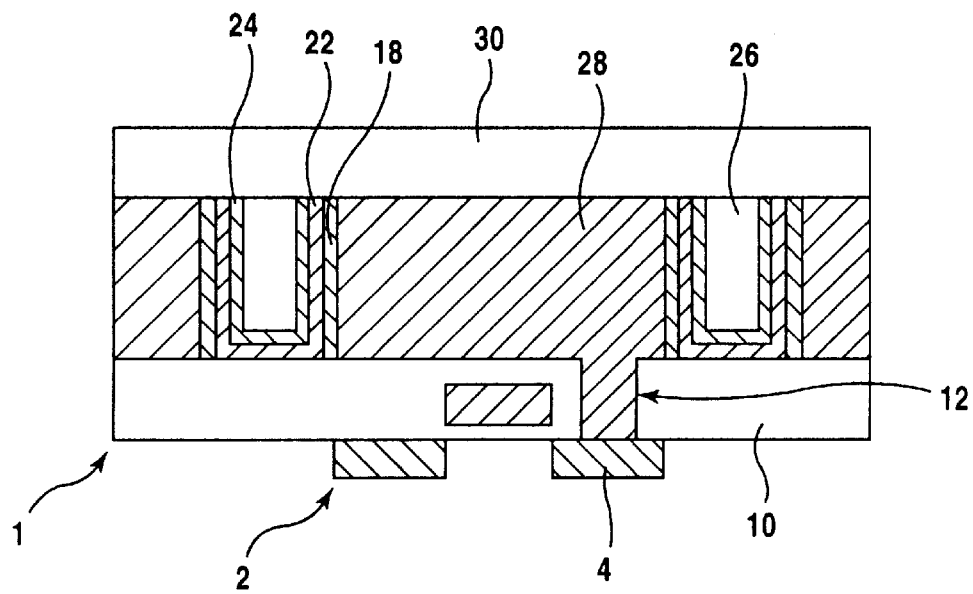

FIG. 1k shows the configuration described after a further method step, in which a second insulation layer 30 has been deposited over the configuration. The capacitance of the storage capacitors used in the semiconductor memory configuration is proportional to the area of the first electrodes 18. In the example illustrated, it becomes evident that the capacitance of the storage capacitors can be further increased by elevating the first electrodes 18.

Figure 2:
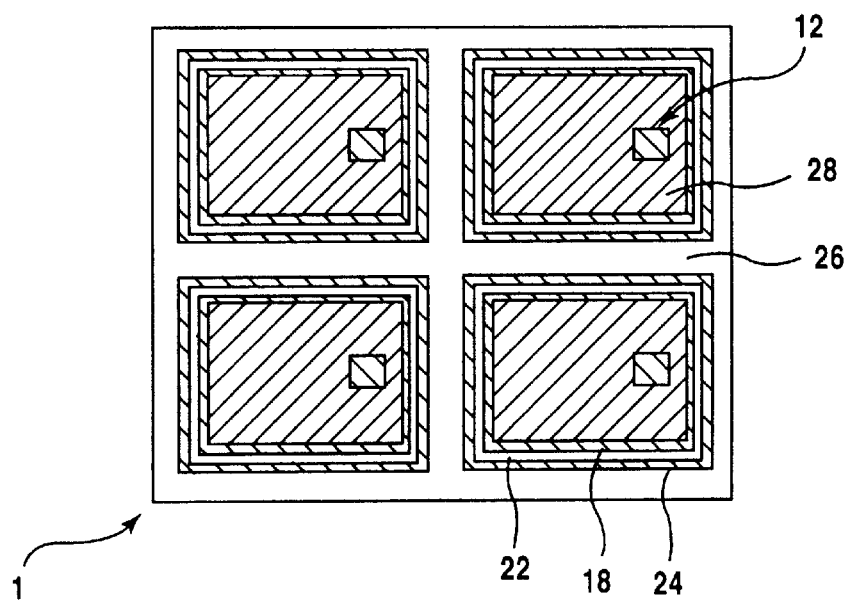
FIG. 2 is a plan view of a memory configuration produced by the method.

FIG. 2 shows a portion of a semiconductor memory configuration produced by the method according to the invention, in a plan view. The configuration illustrated in FIG. 2 shows four memory cells. It becomes clear from the illustrated plan view that the first electrodes 18 encompass a region of the first main area 14 of the insulation layer 10 in which the contact hole 12 is situated in each case. A connection is produced between the first electrode 18 and the source region 4 of one of the selection transistors 2 through the contact hole 12. The source region is situated underneath the contact hole 12. FIG. 2 also illustrates the stabilization 26 situated between the storage capacitors.

We claim:

1. A method for producing an integrated semiconductor memory configuration, which comprises:

providing a configuration of selection transistors in a semiconductor body and an insulation layer disposed above the semiconductor body, the selection transistors having source regions;

producing contact holes in the insulation layer above the source regions;

applying an auxiliary layer on a surface of the insulation layer and subsequently forming cutouts in the auxiliary layer defining side areas of the cutouts;

producing first electrodes on the side areas of the cutouts;

applying a storage dielectric to the first electrodes defining free areas of the storage dielectric;

applying a second electrode to the free areas of the storage dielectric;

removing the auxiliary layer; and producing conductive connections each connecting a respective one of the first electrodes and the source region of a respective one of the selection transistors.

2. The method according to claim 1, which comprises carrying out the step of producing the first electrodes by deposition of a first layer of electrode material and subsequent removal from areas of the auxiliary layer running parallel to the surface.

3. The method according to claim 1, which comprises carrying out the step of producing the first electrodes by deposition of a first layer of electrode material and subsequent removal from uncovered regions of the surface.

4. The method according to claim 1, which comprises carrying out the step of producing the first electrodes by deposition of a first layer of electrode material and subsequent removal from areas of the auxiliary layer running parallel to the surface and from uncovered regions of the surface.

5. The method according to claim 1, which comprises carrying out the steps of applying the storage dielectric and the second electrodes by successive deposition of a dielectric layer and a second layer made of electrode material in the direction of the surface of the insulation layer, and subsequently removing the dielectric layer and the second layer outside the cutouts from areas of the auxiliary layer parallel to the surface of the insulation layer.

6. The method according to claim 5, which comprises, prior to the removal of the two layers from the areas of the auxiliary layer parallel to the surface of the insulation layer, depositing a stabilization layer over the second layer and partially removing the stabilization layer when the two layers are removed.

7. The method according to claim 1, which comprises carrying out the step of producing the conductive connection by filling a region disposed within the first electrodes with a conductive material.

8. The method according to claim 1, which comprises producing the storage dielectric with ferroelectric properties.

9. The method according to claim 1, which comprises producing the storage dielectric with a dielectric constant of greater than 10.

10. The method according to claim 1, which comprises producing the storage dielectric as an oxidic dielectric.

11. The method according to claim 1, which comprises producing the storage dielectric from the group consisting of SBTN $SrBi_2(Ta_{1-x}Nb_x)_2O_9$, SBT $SrBi_2Ta_2O_9$, PZT $(Pb, Zr)TiO_3$, BST $(Ba, Sr)TiO_3$ and ST $SrTiO_3$.

* * * * *